United States Patent [19]

Fukumoto

[11] Patent Number: 5,414,671
[45] Date of Patent: May 9, 1995

[54] SEMICONDUCTOR MEMORY DEVICE HAVING OPERATION CONTROL MEANS WITH DATA JUDGING FUNCTION

[75] Inventor: Katsumi Fukumoto, Nara, Japan
[73] Assignee: Sharp Kabushimi Kaisha, Osaka, Japan
[21] Appl. No.: 694,289
[22] Filed: Apr. 30, 1991
[30] Foreign Application Priority Data May 1, 1990 [JP] Japan .................................. 2-116141
Jul. 30, 1990 [JP] Japan .................................. 2-202958

[51] Int. Cl.⁶ ............................................. G11C 17/00
[52] U.S. Cl. .................................. 365/228; 365/196; 365/203; 365/229
[58] Field of Search ............... 365/226, 228, 229, 222, 365/195, 196, 203

[56] References Cited

U.S. PATENT DOCUMENTS

| 4,218,764 | 8/1980 | Furuta et al. | 365/228 X |
| 4,638,465 | 1/1987 | Rosini et al. | 365/228 |
| 4,800,533 | 1/1989 | Arakawa | 365/228 |
| 4,811,303 | 3/1989 | Hirai | 365/228 X |
| 5,197,026 | 3/1993 | Butler | 365/228 X |

OTHER PUBLICATIONS

Iizuka, *COMOS VLSI Design* published by Baifukan, (Apr. 25, 1989), pp. 170-199.
U.S. patent application Ser. No. 07/549,293 (filed on Jul. 6, 1990).
Yoshioka et al., *Nikkei Electronics* (1987) No. 418, pp. 167-184.
U.S. patent application Ser. No. 07/308,854 (filed Feb. 9, 1989).
U.S. patent application Ser. No. 07/644,332 (filed Jan. 18, 1991).
U.S. patent application Ser. No. 07/585,772 (filed Sep. 20, 1990).
U.S. patent application Ser. No. 07/585,771 (filed Sep. 20, 1990).
U.S. patent application Ser. No. 07/469,346 (filed Jan. 24, 1990).
U.S. patent application Ser. No. 07/488,874 (filed Mar. 6, 1990).
U.S. patent application Ser. No. 07/481,179 (filed Feb. 20, 1990).

*Primary Examiner*—Benny Lee
*Attorney, Agent, or Firm*—Morrison & Foerster

[57] ABSTRACT

In accordance with the levels of input signals, a recall signal or store signal is generated and held. Based on the signal currently held, only one of the read/write timing circuit, recall timing circuit and store timing circuit is enabled for operation with the operation of the other two timing circuit disabled: the recall timing circuit is enabled when the recall signal is held, the store timing circuit when the store signal is held, and the read/write timing circuit when neither the recall signal nor the store signal is held. Therefore, once one operation mode has been selected by setting the input signals to a prescribed combination of levels, the selected mode is held until another operation mode is selected. Since there is no need to input the nonvolatile enable signal $\overline{NE}$ signal during the recall operation, the external input timing can be simplified. Even if noise appears on the write enable signal $\overline{WE}$, there is no possibility of accidentally activating the store timing circuit, thus preventing the data from being destroyed. Before a main amplifying circuit commences the amplification operation, the potential of a common data line is biased to an intermediate potential which is between the power source potential and the ground level.

12 Claims, 10 Drawing Sheets

FIG. 1

FIG. 2A
RECALL/STORE LOGIC CIRCUIT

|    | $\overline{CE}$ | $\overline{NE}$ | $\overline{OE}$ | $\overline{WE}$ |
|----|----|----|----|----|
| Ø4 | L  | L  | H  | L  |
| Ø5 | H  | H  | L  | H  |
| Ø6 | L  | L  | L  | H  |

FIG. 2B
RECALL/STORE LOGIC CIRCUIT

|    | $\overline{CE}$ | $\overline{NE}$ | $\overline{OE}$ | $\overline{WE}$ |
|----|----|----|----|----|
| Ø4 | H  | L  | H  | L  |
| Ø5 | L  | *  | *  | *  |
| Ø6 | H  | L  | L  | H  |

FIG. 3A
READ/WRITE TIMING CIRCUIT

| INPUT | $\overline{CE}$ | $\overline{OE}$ | $\overline{WE}$ |            |
|-------|----|----|----|------------|
|       | L  | L  | H  | DRAM READ  |
|       | L  | H  | L  | DRAM WRITE |
|       | L  | H  | H  | REFRESH    |

FIG. 3B
READ/WRITE TIMING CIRCUIT

| INPUT | $\overline{CE}$ | $\overline{OE}$ | $\overline{WE}$ |            |
|-------|----|----|----|------------|
|       | L  | L  | H  | DRAM READ  |
|       | L  | H  | L  | DRAM WRITE |
|       | H  | L  | H  | REFRESH    |

FIG. 4A
RECALL TIMING CIRCUIT

| INPUT | $\overline{CE}$ | $\overline{OE}$ |         |
|-------|----|----|---------|
|       | L  | L  | RECALL  |

FIG. 4B
RECALL TIMING CIRCUIT

| INPUT | $\overline{CE}$ | $\overline{OE}$ |         |
|-------|----|----|---------|
|       | H  | L  | RECALL  |

READ

FIG. 12A
(PRIOR ART)

WRITE

FIG. 12B
(PRIOR ART)

RECALL

FIG. 12C
(PRIOR ART)

STORE

FIG. 12D
(PRIOR ART)

REFRESH

SEMICONDUCTOR MEMORY DEVICE HAVING OPERATION CONTROL MEANS WITH DATA JUDGING FUNCTION

BACKGROUND OF THE INVENTION

1. Field of the Invention

This invention relates to a semiconductor memory device, and more particularly to a semiconductor memory device having memory cells each of which comprises a volatile memory unit and a nonvolatile memory unit. This invention also relates to a semiconductor memory device having an improved precharge circuit.

2. Description of the Prior Art

Some kinds of semiconductor memories have memory cells each of which comprises a combination of a dynamic random access memory (DRAM) unit and an electrically erasable programmable read-only memory (EEPROM) unit. These memory cells are arranged on a chip to form a memory array. When data is read out of or written into the memory cell (read operation or write operation), only the DRAM unit is operated. On the other hand, both the DRAM unit and EEPROM unit are operated when data stored in the DRAM unit is transferred to the EEPROM unit (store operation) or when data stored in the EEPROM unit is recalled to the DRAM unit (recall operation). Once the data stored in the DRAM unit has been transferred to the EEPROM unit, the data is retained in the EEPROM unit even after power is turned off. This allows the data retained in the EEPROM unit to be recalled to the DRAM unit when the power is turned on again.

Figure 11:
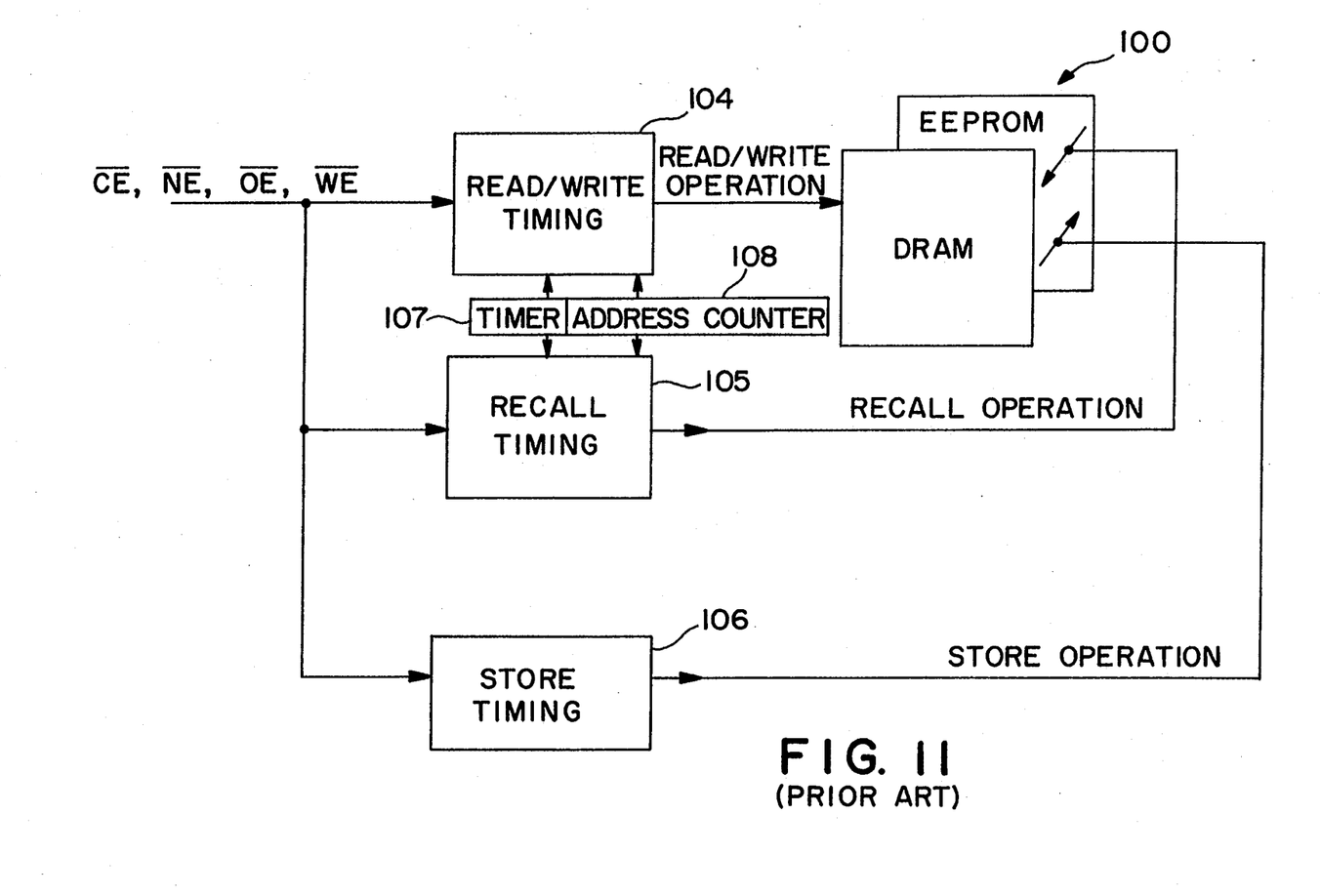
FIG. 11 is a block diagram illustrating a prior art semiconductor memory device.

As means for respectively performing the read/write, recall, and store operations, it is known to use a read/write timing circuit, a recall timing circuit, and a store timing circuit. Such timing circuits were proposed in "CMOS VLSI Design" published by Baifukan, Japanese Patent Application No. 2-43391, and Nikkei Electronics 1987 (No.418) p.p.167-184. FIG. 11 illustrates one example of a prior art semiconductor memory device in which these timing circuits are used.

In the memory device of FIG. 11, four input signals, i.e., a chip enable signal $\overline{CE}$, a nonvolatile enable signal $\overline{NE}$, an output enable signal $\overline{OE}$, and a write enable signal $\overline{WE}$ are input from an external circuit to a read/write timing circuit 104, recall timing circuit 105 and store timing circuit 106. These signals are all active low and inactive high logic signals. The chip enable signal $\overline{CE}$ indicates that the chip on which a memory array 100 is formed is selected, and the nonvolatile enable signal $\overline{NE}$ is issued to enable the recall or store operation. The output enable signal $\overline{OE}$ enables data read operation to output data from the memory array to an external device, while the write enable signal $\overline{WE}$ is used to enable data write operation to input data from an external device to the memory array.

Figure 12A:
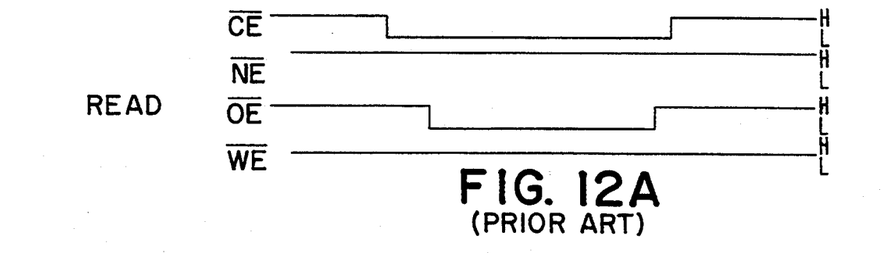
FIGS. 12A to 12E are timing charts illustrating the operation of the memory device of FIG. 11.
Figure 12B:
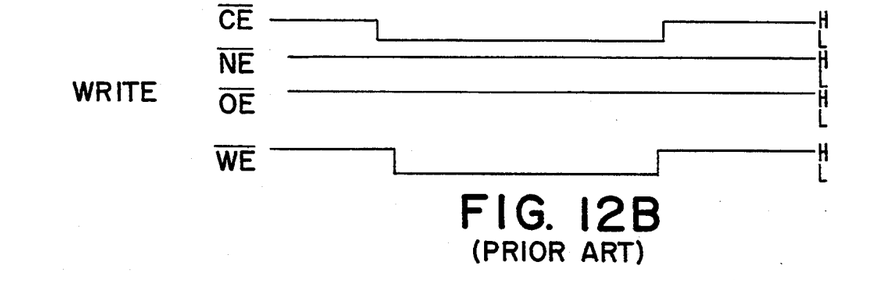
Figure 12C:
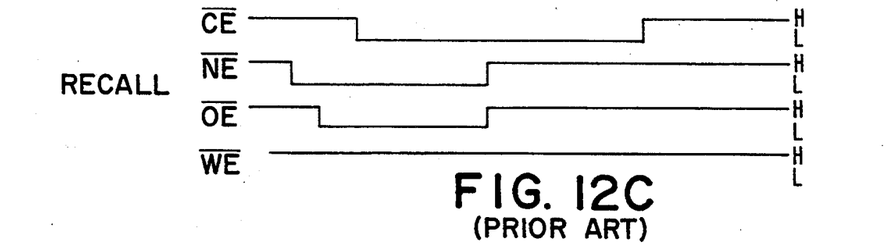
Figure 12D:
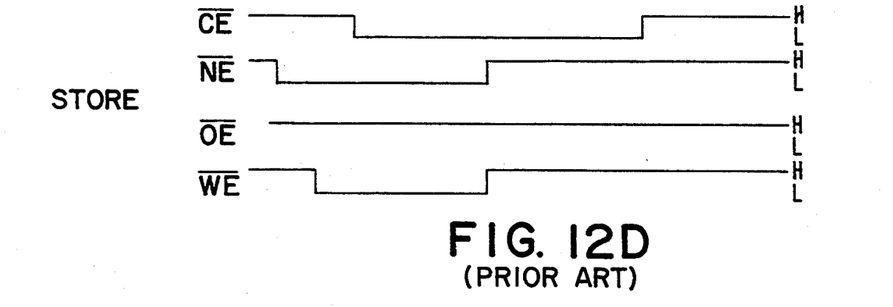

The operation of the memory device of FIG. 11 will be described with reference to FIGS. 12A-12E. When the read operation is to be performed, the chip enable signal $\overline{CE}$ and output enable signal $\overline{OE}$ are set LOW to activate the read/write timing circuit 104, while holding the nonvolatile enable signal $\overline{NE}$ HIGH to disable the recall timing circuit 105 and the store timing circuit 106 (FIG. 12A). In the read operation, the write enable signal $\overline{WE}$ is held HIGH. When the writing operation is to be performed, the chip enable signal $\overline{CE}$ and the write enable signal $\overline{WE}$ are set LOW to activate the read/write timing circuit 104, while holding the nonvolatile enable signal $\overline{NE}$ and output enable signal $\overline{OE}$ HIGH (FIG. 12B) (while disabling the recall timing circuit 105 and the store timing circuit 106). The recall operation is performed, as shown in FIG. 12C, by first setting the nonvolatile enable signal $\overline{NE}$ to LOW to disable the operation of the read/write timing circuit 104 and then setting the output enable signal $\overline{OE}$ and chip enable signal $\overline{CE}$ to LOW to enable the recall timing circuit 105. In the recall operation, the write enable signal $\overline{WE}$ is held HIGH. The store operation is performed, as shown in FIG. 12D, by first setting the nonvolatile enable signal $\overline{NE}$ to LOW to disable the read/write timing circuit 104 and then setting the write enable signal $\overline{WE}$ and chip enable signal $\overline{CE}$ to LOW to enable the store timing circuit 106. In the store operation, the output enable signal $\overline{OE}$ is held HIGH.

Figure 12E:
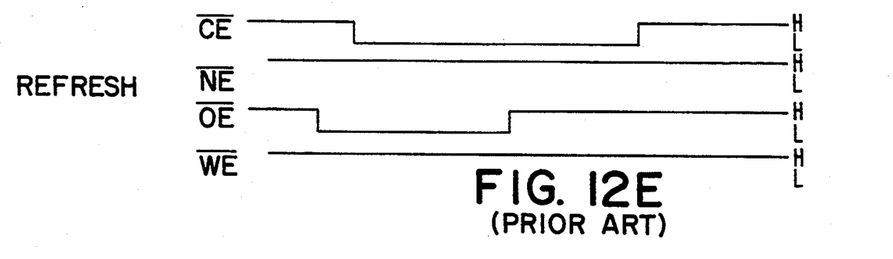

In the DRAM unit, charges gradually leak, and therefore the refresh operation must be carried out to prevent stored data from disappearing. When the refresh operation is to be performed, the output enable signal $\overline{OE}$ and chip enable signal $\overline{CE}$ are set LOW to enable the read/write timing circuit 104, while holding the nonvolatile enable signal $\overline{NE}$ and write enable signal $\overline{WE}$ HIGH (FIG. 12E) (while disabling the recall timing circuit 105 and the store timing circuit 106). The refresh operation immediately after the store operation may be substituted with the recall operation.

In the semiconductor memory device of FIG. 11, the DRAM units are not provided with a signal amplification function, and therefore the signal output from each DRAM unit must be amplified on the bit line by a sense amplifier. This necessitates the recall operation to be performed for every page, i.e., for every group of memory cells connected to a word line which is addressed by an address counter 108 (which is updated by a timer 107 as shown in FIG. 11 or the rising edge of $\overline{OE}$ in FIG. 12C). As a result, recalling all pages requires the input operation to be performed the number of times equal to the total number of word lines (for example, 512 times) using the timing shown in FIG. 12C. Thus, in the conventional device in which the timing circuits 104, 105 and 106 are simply combined, there occurs the problem that the timing of inputting external signals is complicated.

Figure 15:
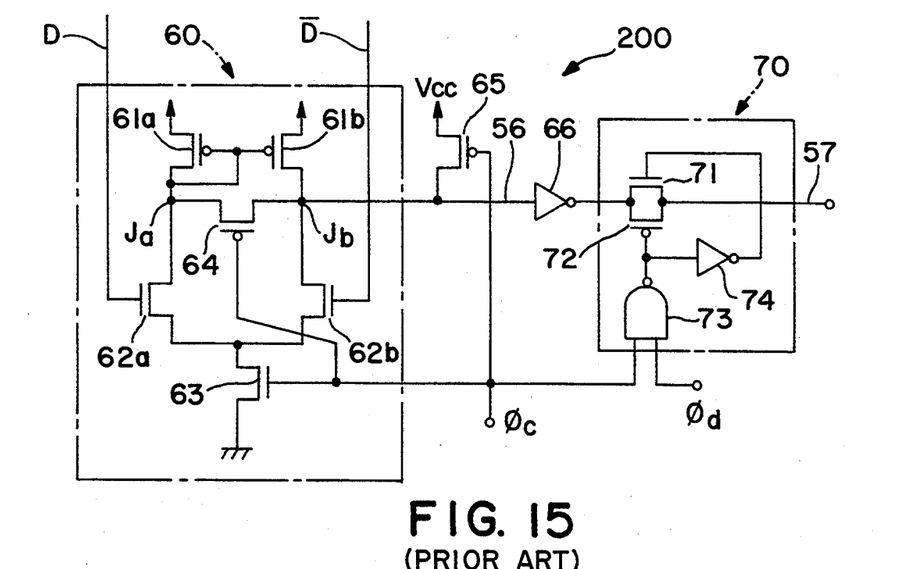
FIG. 15 is a circuit diagram illustrating a main amplifying circuit used in the other semiconductor memory device and in a prior art semiconductor memory device.
Figure 16:
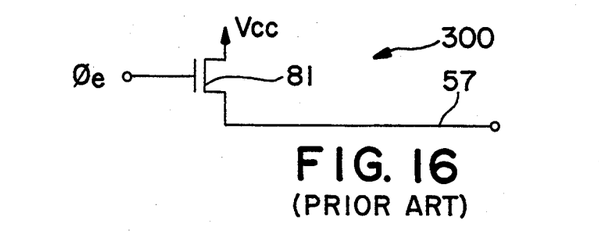
FIG. 16 is a circuit diagram of a precharge circuit used in the prior art semiconductor memory device.

FIGS. 15 and 16 illustrate a main amplifying circuit 200 and precharge circuit 300 used in a prior art semiconductor memory device, respectively. The main amplifying circuit 200 comprises a main amplifier 60, and a connection circuit 70. The main amplifier 60 amplifies the signal on a pair of data lines D and $\overline{D}$, and outputs the amplified signal onto an output line 56. The connection circuit 70 receives the amplified signal through an inverter 66, and transfers it onto a common data line 57. The data lines D and $\overline{D}$ are connected to a memory cell via bit lines (not shown). The common data line 57 is connected to an I/O buffer circuit of the semiconductor memory device, and functions as a path for transferring data when data is read from or written into the memory cell. The precharge circuit 300 comprises an N-transistor 81 which is connected between a power source ($V_{cc}$) and the common data line 57.

Figure 17:
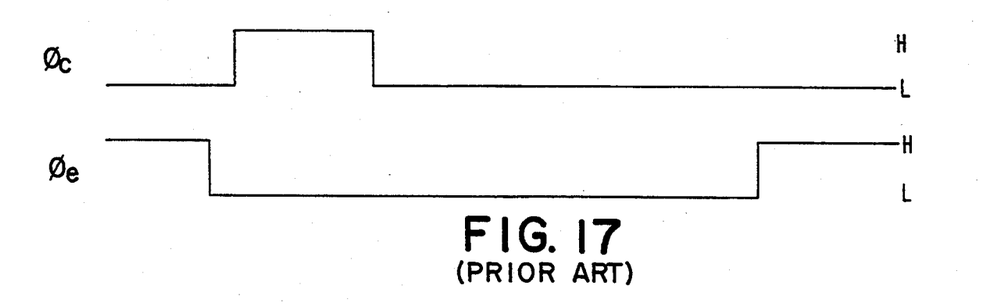
FIG. 17 is a timing chart illustrating the operation of the prior art semiconductor memory device.

When the read operation is to be performed, a main amplifier enable signal $\phi_c$ and a precharge signal $\phi_e$ are previously set LOW and HIGH, respectively (as shown in FIG. 17). The output line 56 and common data line 57 are biased (or precharged) through a P-transistor 65 and the N-transistor 81, respectively. A P-transistor 64 in the main amplifier 60 is turned on so that the junction point $J_a$ between a pullup P-transistor 61a and a pulldown N-transistor 62a and the junction point $J_b$ between a pullup P-transistor 61b and a pulldown N-transistor 62b are biased to the same potential ($V_{cc}$). In the read operation, a write signal $\phi_d$ is maintained HIGH. Thereafter, the precharge signal $\phi_e$ is set LOW to turn off the N-transistor 81, thereby completing the precharge of the common data line 57. The main amplifier enable signal $\phi_c$ is then set HIGH so that the P-transistor 65 is turned off to complete the precharge of the output line 56. At the same time, the P-transistor 64 is turned off, and an N-transistor 63 in the main amplifier 60 is turned on. This enables the combination of the pullup P-transistors 61a and 61b and pulldown N-transistors 62a and 62b to amplify the data signal on the data lines D and $\overline{D}$. The amplified data signal is output through the output line 56.

When the main amplifier enable signal $\phi_c$ is set HIGH, the output of a NAND gate 73 in the connection circuit 70 becomes LOW to turn on a P-transistor 72 and turn off an N-transistor 71, the gate of which is connected to the output of NAND gate 73 through an inverter 74. Therefore, the output of the main amplifier 60 on the output line 56 is transferred to the common data line 57 via the inverter 66 and transistors 71 and 72. In this way, the data read operation is performed.

Along with the remarkable progress of memory capacity, the chip size of a semiconductor memory device has gradually increased. As a result, the length of the common data line 57 in a large capacity memory device becomes longer to a degree that the delay time caused by the common data line 57 cannot be neglected. In the semiconductor memory device described above, particularly, the output level of the main amplifier 60 must change by a degree up to as much as the half of the power source potential ($V_{cc}$) until it reaches the threshold level of the next stage, resulting in that the delay time caused by the common data line 57 is prolonged.

SUMMARY OF THE INVENTION

The semiconductor memory device of this invention, which overcomes the above-discussed and numerous other disadvantages and deficiencies of the prior art.

According to one aspect of the invention, the semiconductor memory device comprises: an array of memory cells, each of said memory cells comprising a volatile memory unit and a nonvolatile memory unit; a port for receiving at least a chip enable signal, a nonvolatile enable signal, an output enable signal, and a write enable signal; read/write means for performing the read operation or write operation on volatile memory units; recall means for performing the recall operation on said memory cells; store means for performing the store operation on said memory cells; and operation control means for generating first and second signals on the basis of said chip enable signal, nonvolatile enable signal, output enable signal and write enable signal, said first signal being indicative of the disabling of said read/write means and store means, said second signal being indicative of the disabling of said read/write means and recall means.

According to the invention, when the four input signals are set to predetermined combinations of levels, the operation control means produces the first signal (recall signal) or the second signal (store signal) in accordance with the input signal levels and holds the thus produced signal. Based on the signal currently held, only one of the read/write means, recall means and store means is enabled for operation with the operation of the other two means disabled: the recall means is enabled when the first signal (recall signal) is held, the store means when the second signal (store signal) is held, and the read/write means when neither the first signal (recall signal) nor the second signal (store signal) is held. Therefore, once one operation mode has been selected by setting the input signals to a prescribed combination of levels, the selected mode is held until another operation mode is selected. This reduces the number of times to input the nonvolatile enable signal $\overline{NE}$ and simplifies the external input timing.

Therefore, in performing the recall operation one page at a time in units of word lines, once the recall operation state has been selected using the nonvolatile enable signal $\overline{NE}$ at the beginning, recall of each page can be performed without inputting the nonvolatile enable signal $\overline{NE}$ during the period of the recall operation mode. Since there is no need to input the nonvolatile enable signal $\overline{NE}$ during the recall operation, the external input timing can be simplified. Also, even if noise appears on the write enable signal $\overline{WE}$ causing it to go active while the page-by-page recalling is performed in units of word lines, since the recall operation mode is held by the operation control means with the store operation disabled, there is no possibility of accidentally activating the store means, thus preventing the data from being destroyed.

In preferred embodiments, the read/write means further performs the refresh operation on the volatile memory units.

In preferred embodiments, the store means is enabled when the second signal is generated.

In preferred embodiments, the operation control means comprises latch means for latching only one of the first and second signals.

In preferred embodiments, the operation control means comprises reset means for resetting one of the first and second signals when the other of the first and second signals is to be generated.

In preferred embodiments, the memory device further comprises monitor means for monitoring a power supply voltage, and for generating a power-on signal indicative that the memory device is powered on, and the operation control means comprises latch means for latching only one of the first and second signals, the latch means being set to latch said first signal, when the power-on signal is generated.

In preferred embodiments, the memory device further comprises monitor means for monitoring a power supply voltage, and for generating a power-off signal indicative that the memory device is powered off, and the operation control means comprises latch means for latching only one of the first and second signals, the latch means being set to latch said second signal, when the power-off signal is generated.

In preferred embodiments, the operation control means generates the first signal when the store operation is completed.

According to another aspect of the invention, the semiconductor memory device comprises: an array of memory cells; a main amplifying circuit for amplifying a data signal which is read from one of the memory cells, the main amplifying circuit being connected to a power source potential; a common data line for transferring the amplified data signal to an I/0 buffer circuit of the memory device; and a precharge circuit for biasing the common data line before the main amplifying circuit begins to amplify the data signal, to a predetermined potential other than the power source potential.

In preferred embodiments, the predetermined potential level is between the power source potential and the ground level.

In preferred embodiments, the predetermined potential is half of the power source potential.

In preferred embodiments, the precharge circuit comprises a series circuit of two transistors, one of the transistors being connected to the predetermined potential, the other of the transistors being connected to the ground.

Thus, the invention described herein makes possible the objectives of:
(1) providing a semiconductor memory device which can operate with a simplified timing of external signals; and
(2) providing a semiconductor memory device in which the delay time caused by a common data line can be shortened.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
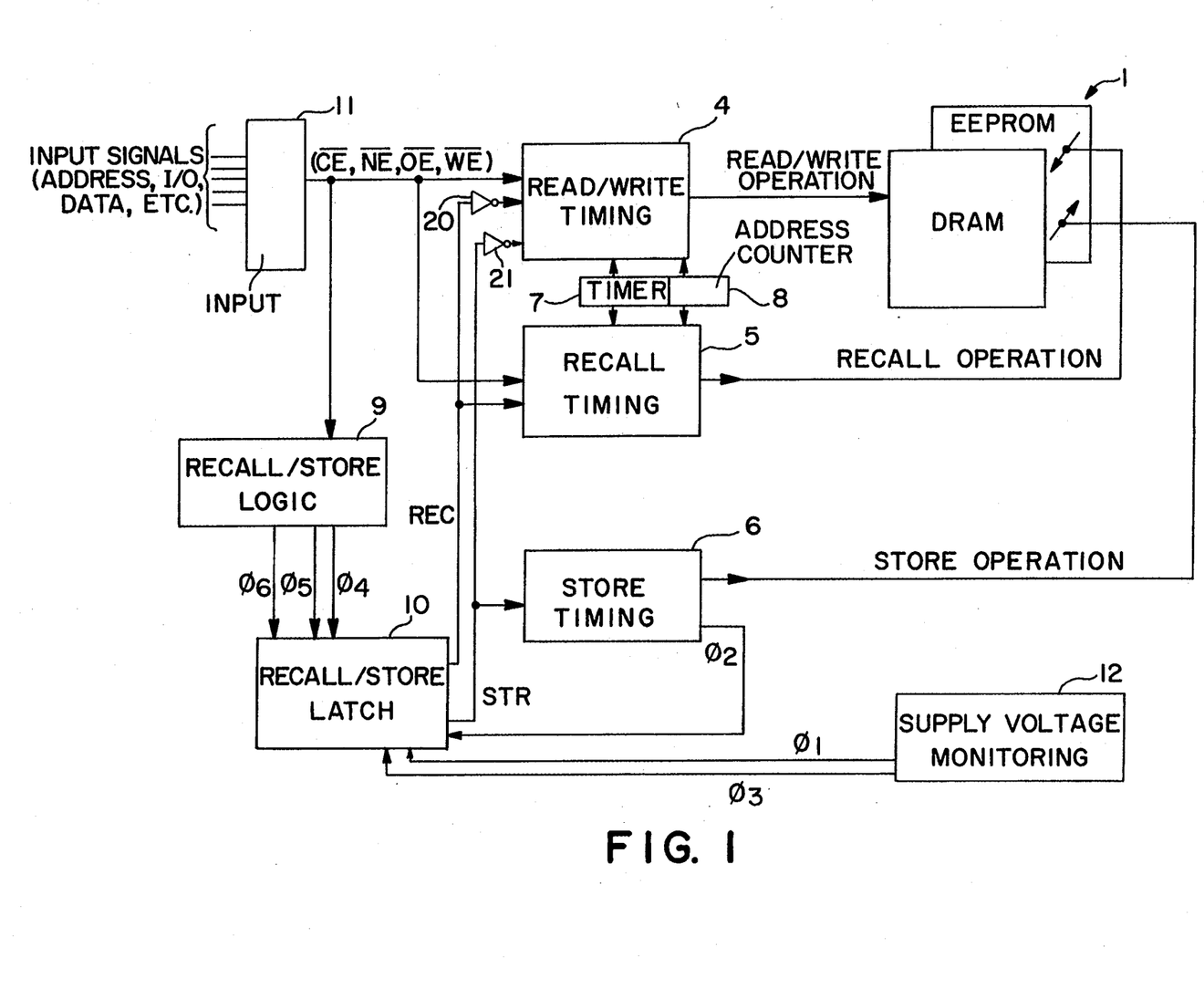
FIG. 1 is a block diagram of a semiconductor memory device according to the invention.

FIG. 1 illustrates a semiconductor memory device according to the invention. The semiconductor memory device of FIG. 1 comprises a memory array 1, a read/write timing circuit 4, a recall timing circuit 5, a store timing circuit 6, an input circuit 11 for receiving external input signals, a recall/store logic circuit 9, and a recall/store latch circuit 10. The circuits 9 and 10 act as operation state holding means. The memory device further comprises a supply voltage monitoring circuit 12. The memory array 1 has a number of memory cells arranged on a chip. Each of the memory cells consists of a DRAM unit and an EEPROM unit combined together.

Figure 3A:
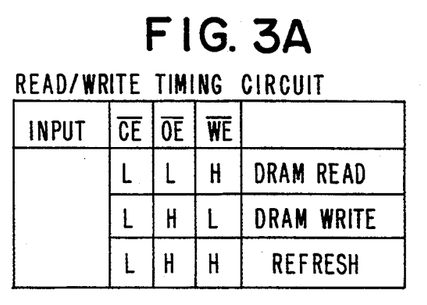
FIGS. 3A and 3B are logic tables illustrating the operation of a read/write timing circuit used in the memory device of FIG. 1.

The read/write timing circuit 4 and recall/store logic circuit 9 receive a chip enable signal $\overline{CE}$, a nonvolatile enable signal $\overline{NE}$, an output enable signal $\overline{OE}$, and a write enable signal $\overline{WE}$ from an external device through the input circuit 11. The read/write timing circuit 4 performs the read, write or refresh operation to read, write or refresh data on the DRAM unit of each memory cell in the memory array 1, in accordance with the levels of these signals and a recall signal REC and store signal STR which are supplied from a recall/store latch circuit 10 through inverters 20 and 21. More specifically, when neither the recall signal REC nor the store signal STR is latched by the recall/store latch circuit 10, the read, write or refresh operation is performed in accordance with the levels of the signals $\overline{CE}$, $\overline{OE}$ and $\overline{WE}$. As shown in FIG. 3A, when the chip enable signal $\overline{CE}$, the output enable signal $\overline{OE}$ and the write enable signal $\overline{WE}$ are respectively LOW, LOW and HIGH, the read operation is conducted, and when LOW, HIGH and LOW, the write operation is conducted, and when LOW, HIGH and HIGH, the refresh operation is conducted. Referring again to FIG. 1, the address of a memory cell on which the read, write or refresh operation is to be performed is specified by an address counter 8 (which is updated by a timer 7 or the rising edge of $\overline{OE}$) or by an external address.

Figure 4A:
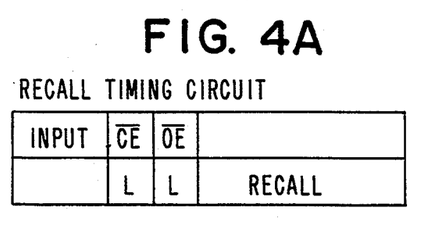
FIGS. 4A and 4B are logic tables illustrating the operation of a recall timing circuit used in the memory device of FIG. 1.

With continuing reference to FIG. 1 the recall timing circuit 5 sequentially performs the recall operation on each of the memory cells of the memory array 1 when the recall signal REC is latched by the recall/store latch circuit 10, and when both the chip enable signal $\overline{CE}$ and the output enable signal $\overline{OE}$ are LOW as shown in FIG. 4A. The recall operation is performed on one page as a unit, i.e., on memory cells at a time which are connected to one word line addressed by the address counter 8.

In response to the store signal STR from the recall/store latch circuit 10, the store timing circuit 6 performs the store operation collectively on the memory cells of the memory array 1 based on the generating timing of the store signal STR. When the store operation is completed, the store timing circuit 6 outputs a store operation termination pulse $\phi_2$ to the recall/store latch circuit 10.

Figure 7:
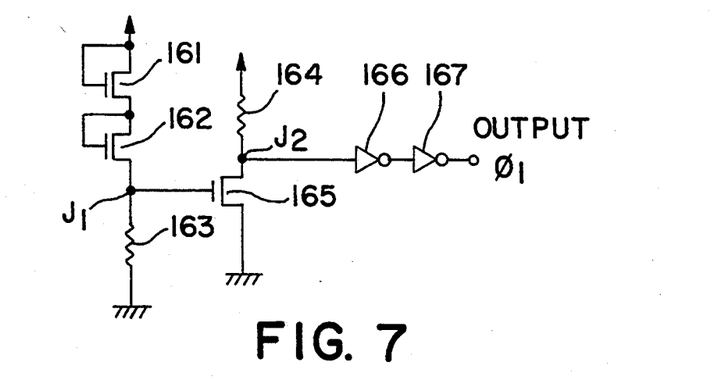
FIG. 7 is a circuit diagram illustrating a portion of a supply voltage monitoring circuit used in the memory device of FIG. 1.

The supply voltage monitoring circuit 12 outputs to the recall/store latch circuit 10 a power-on detection pulse $\phi_1$ when the power is turned on, to indicate that the recall operation should be performed. The supply voltage monitoring circuit 12 outputs also a power-off detection pulse $\phi_3$ when the power drops below a predetermined level or is turned off, to indicate that the store operation should be performed. With brief reference to FIG. 7, shown is circuitry for generating the power-on detection pulse $\phi_1$. In this circuitry, N-MOS transistors 161 and 162 and a resistor 163 are connected in series in this order between the power supply and the ground, and a resistor 164 and an N-transistor 165 are connected in series in this order. The Junction point $J_1$ between the N-transistor 162 and the resistor 163 is connected to the gate of the N-transistor 165. Inverters 166 and 167 are connected to the junction point $J_2$ between the resistor 164 and the N-transistor 165. When the power is off, the N-transistor 165 is off so that the potential at the junction point $J_2$ is at the ground level. When the power is turned on and its level rises, the potential at the junction point $J_2$ immediately rises. Then, the N-transistors 161 and 162 are turned on, which causes the potential at the junction point $J_1$ to increase, thereby turning on the N-transistor 165. The potential at the junction point $J_2$ returns to the ground level. Thus, the output of the inverter 167 can be used as the power-on detection pulse $\phi_1$.

Figure 2A:
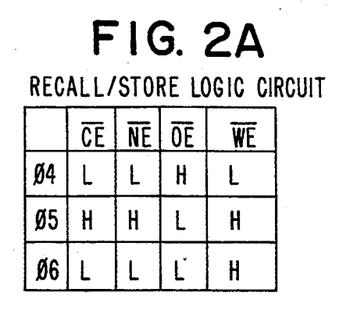
FIGS. 2A and 2B are logic tables illustrating the operation of a recall store logic circuit used in the memory device of FIG. 1.

Referring again to FIG. 1, the recall/store logic circuit 9 outputs a store operation initiation signal $\phi_4$ indicative of the initiation of the store operation, when the input chip enable signal $\overline{CE}$, nonvolatile enable signal $\overline{NE}$, output enable signal $\overline{OE}$ and write enable signal $\overline{WE}$ are LOW, LOW, HIGH and LOW, respectively, as shown in the upper row of FIG. 2A. When these input signals are HIGH, HIGH, LOW and HIGH, respectively (as shown in the middle row of FIG. 2A), the circuit 9 outputs a recall latch reset signal $\phi_5$ to indicate the termination of the recall operation. Furthermore, when these input signals are LOW, LOW, LOW and HIGH, respectively (as shown in the bottom row of FIG. 2A), the circuit 9 outputs a recall latch set signal $\phi_6$ to indicate enabling the recall operation. These signals $\phi_4$, $\phi_5$ and $\phi_6$ are pulse signals with relatively short duration, and are all supplied to the recall/store latch circuit 10.

Figure 5:
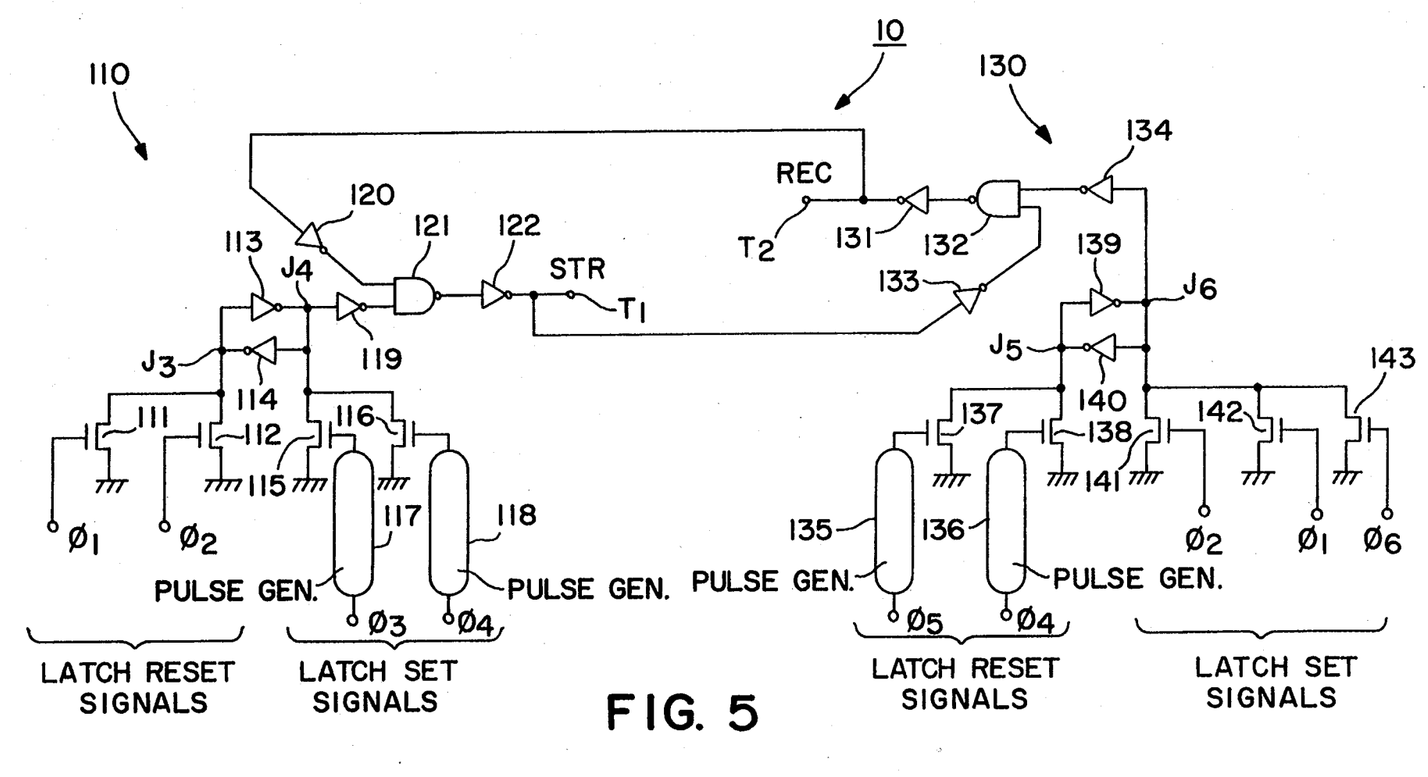
FIG. 5 is a circuit diagram of a recall/store latch circuit used in the memory device of FIG. 1.
Figure 6:
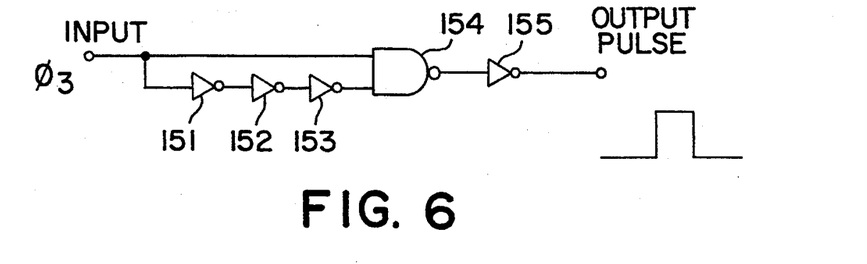
FIG. 6 is a circuit diagram of a pulse generating circuit used in the recall/store latch circuit of FIG. 5.

As shown in FIG. 5, the recall/store latch circuit 10 comprises a store latch block 110, and a recall latch block 130. In the store latch block 110, inverters 113 and 114 are connected in inverse parallel with each other, and N-transistors 111 and 112 are connected in parallel between the ground and a junction point $J_3$ between the inverters 113 and 114. The transistors 111 and 112 are respectively driven by the power-on detection pulse $\phi_1$ and the store operation termination pulse $\phi_2$. N-transistors 115 and 116 are connected in parallel between the ground and the other junction point $J_4$, and respectively driven by the power-off detection signal $\phi_3$ and store operation initiation signal $\phi_4$ respectively supplied through pulse generating circuits 117 and 118. The junction point $J_4$ is coupled to an input of a NAND gate 121 through an inverter 119. The other input of the NAND gate 121 is coupled to the output of an inverter 120 the input of which is coupled to the output $T_2$ of the recall latch block 130. Referring again to FIG. 5, the output of the NAND gate 121 is coupled to an output terminal $T_1$ of the store latch block 110 through an inverter 122. The pulse generating circuits 117 and 118 are constructed as shown in FIG. 6. The power-off detection signal $\phi_3$ or the store operation initiation signal $\phi_4$ is supplied directly to one input of a NAND gate 154, and in a delayed manner through a series circuit of inverters 151-153 to the other input of the NAND gate 154. The output of the NAND gate 154 is output through an inverter 155. In the pulse generating circuits 117 and 118, the HIGH period of the signals $\phi_3$ and $\phi_4$ is made constant so that the outputs of the circuits 117 and 118 are prevented from being HIGH simultaneously.

The inverters 113 and 114 hold the level of the junction point $J_3$ at the ground level and the junction point $J_4$ at the power supply level when the power-on detection pulse $\phi_1$ or the store operation termination pulse $\phi_2$ is input, and hold the level of the junction point $J_3$ at the power supply level and the junction point $J_4$ at the ground level when the poweroff detection signal $\phi_3$ or the store operation initiation signal $\phi_4$ is input. The NAND gate 121 receives the signal level at the junction point $J_4$ which has been inverted by the inverter 119, and the recall signal REC from the recall latch block 130 which has been inverted by the inverter 120. Therefore, at the output $T_1$ of the store latch block 110, the store signal STR (HIGH) is held only when the recall signal REC is not output from the recall latch block 130 (i.e., when the recall signal REC is LOW).

On the other hand, in the recall latch block 130, inverters 139 and 140 are connected in inverse parallel with each other, and N-transistors 137 and 138 are connected in parallel between the ground and a junction point $J_5$ between the inverters 139 and 140. The transistors 137 and 138 are respectively driven by the recall latch reset signal $\phi_5$ and the store operation initiation signal $\phi_4$ respectively supplied through pulse generating circuits 135 and 136. N-transistors 141, 142 and 143 are connected in parallel between the ground and the other junction point $J_6$, and respectively driven by the store operation termination pulse $\phi_2$, power-on detection pulse $\phi_1$ and recall latch set signal $\phi_6$. The junction point $J_6$ is coupled to an input of a NAND gate 132 through an inverter 134. The other input of the NAND gate 132 is coupled to the output of an inverter 133 the input of which is coupled to the output $T_1$ of the store latch block 110. The output of the NAND gate 132 is coupled to the output terminal $T_2$ of the recall latch block 130 through an inverter 131. The pulse generating circuits 135 and 136 are constructed in the same manner as those of the pulse generating circuits 117 and 118 described before.

The inverters 139 and 140 hold the level of the junction point $J_5$ at the ground level and the junction point $J_6$ at the power supply level when the recall latch reset signal $\phi_5$ or the store operation initiation signal $\phi_4$ is input, and hold the level of the junction point $J_5$ at the power supply level and the junction point $J_6$ at the ground level when the store operation termination pulse $\phi_2$ the power-on detection pulse $\phi_1$ or the recall latch set signal $\phi_6$ is input. The NAND gate 132 receives the signal level at the junction point $J_6$ which has been inverted by the inverter 134, and the store signal STR from the store latch block 110 which has been inverted by the inverter 133. Therefore, at the output $T_2$ of the recall latch block 130, the recall signal REC (HIGH) is held only when the store signal STR is not output from the store latch block 110 (i.e., when the store signal STR is LOW).

Figure 9A:
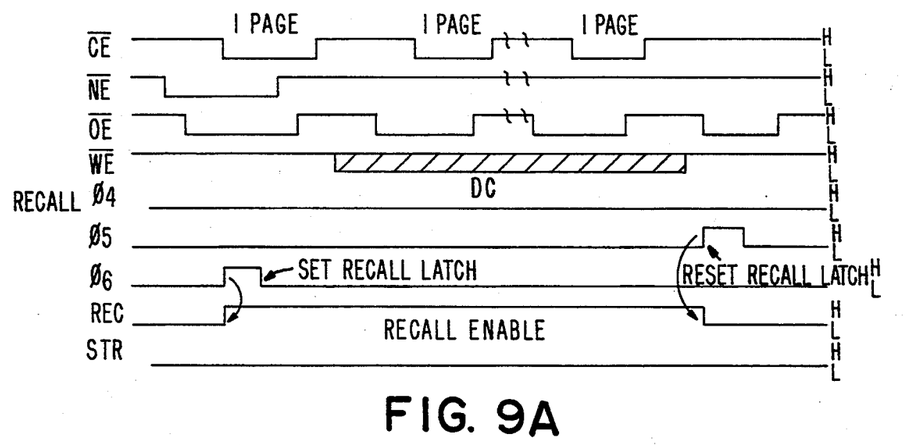
FIGS. 9A and 9B are timing charts illustrating the recall operation and store operation of the memory device of FIG. 1, in which the logic table of FIG. 2A is used.
Figure 9B:
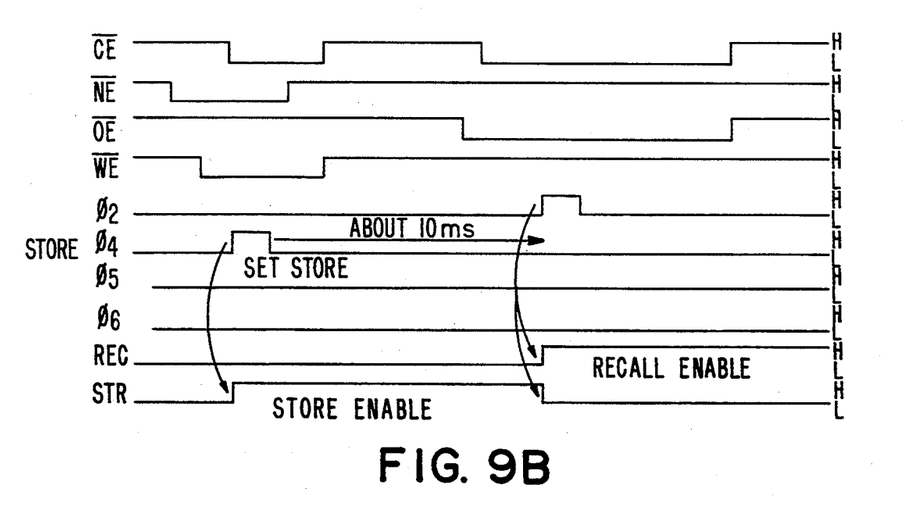
Figure 10A:
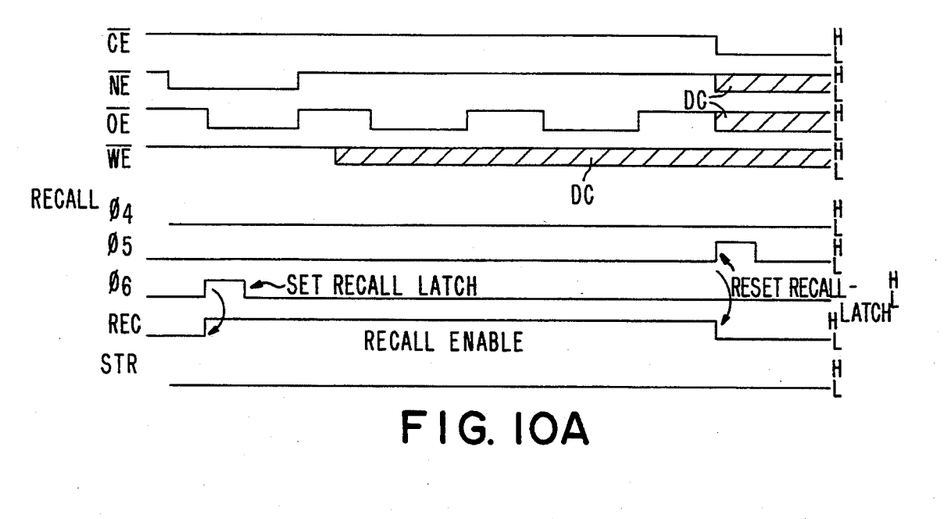
FIGS. 10A and 10B are timing charts illustrating the recall operation and store operation of the memory device of FIG. 1, in which the logic table of FIG. 2B is used.
Figure 10B:
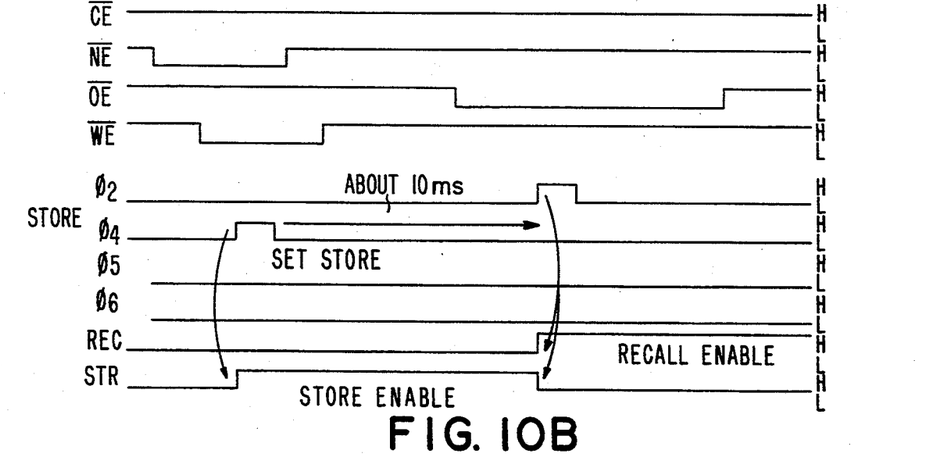

Referring briefly to FIGS. 9A-9B and 10A-10B, FIGS. 9A and 9B are timing charts illustrating the recall operation and the store operation of the memory device of the present invention using control signals generated in accordance with logic table of FIG. 2A. FIGS. 10A and 10B are timing charts illustrating the recall operation and the store operation of the memory device of the present invention using control signals generated in accordance with logic table of FIG. 2B. In the timing charts of FIGS. 9A, 9B, 10A, and 10B the function is controlled by signals $\overline{CE}$ (Chip Enable), $\overline{NE}$ (Nonvolatile Enable), $\overline{OE}$ (Output Enable) and $\overline{WE}$ (Write Enable). Three timing signals $\phi_4$, $\phi_5$ and $\phi_6$ are directly derived from these control signals in accordance with logic tables shown in FIGS. 2A and 2B, respectively. Two output signals REC (Recall latch set) and STR (Store latch set) indicate conditions of latches. Timing signal $\phi_2$ is generated by a timing circuit 6 (FIG. 1). Reference, '1 PAGE' in FIG. 9A denotes a time period during which "a page" is recalled; "page" representing all memory cells connected to one word line. In FIGS. 9B and 10B the reference 'ABOUT 10 ms' represents the time period between timing signal $\phi_4$ transition from HIGH to LOW to HIGH. Except as otherwise indicated herein, like reference labels are used to refer to like elements in FIGS. 9A–9B and 10A–10B.

As shown in FIG. 1, the recall signal REC is directly supplied to the recall timing circuit 5, and to the read/write timing circuit 4 through the inverter 20, and the store signal STR is directly supplied to the store timing circuit 6, and to the read/write timing circuit 4 through the inverter 21. As a result, only one of the three timing circuits 4, 5 and 6 is enabled for operation, while the other two timing circuits are disabled. Namely, only the recall timing circuit 5 is enabled when the recall signal REC is latched by the recall/store latch circuit 10, only the store timing circuit 6 when the store signal STR is latched, and only the read/write timing circuit 4 when neither the recall signal REC nor the store signal STR is latched.

Referring again to FIG. 9A, the recall operation will be described. It is assumed that, as shown at the extreme left in FIG. 9A, the chip enable signal $\overline{CE}$, nonvolatile enable signal $\overline{NE}$, output enable signal $\overline{OE}$ and write enable signal $\overline{WE}$ are all HIGH, and the recall/store latch circuit 10 holds neither the recall signal REC nor the store signal STR (standby state). Under this state, when the nonvolatile enable signal $\overline{NE}$ goes LOW and then the output enable signal $\overline{OE}$ and chip enable signal $\overline{CE}$ go LOW, the recall/store logic circuit 9 generates the recall latch set signal $\phi_6$, and outputs it to the recall/store latch circuit 10. After the generation of the recall latch set signal $\phi_6$, the nonvolatile enable signal $\overline{NE}$ returns to HIGH. In response to the recall latch set signal $\phi_6$, the recall/store latch circuit 10 produces the recall signal REC (HIGH) and latches it in that state. This state (designated RECALL ENABLE) enables the operation of the recall timing circuit 5, while disabling the operation of the other two timing circuits 4 and 6 (recall operation mode).

In this recall operation mode, page-by-page recall can be carried out by setting the output enable signal $\overline{OE}$ and chip enable signal $\overline{CE}$ to LOW while holding the nonvolatile enable signal $\overline{NE}$ at HIGH. This means that once the recall operation state is selected at the beginning, recalling of all pages can be done without inputting the nonvolatile enable signal $\overline{NE}$ for every page, as long as the recall operation state is held. According to the embodiment, therefore, it is not required to frequently input the nonvolatile enable signal $\overline{NE}$ during the recall operation, thereby enabling the input timing of external signals to be simplified. Also, even if noise appears in the write enable signal $\overline{WE}$ causing it to go LOW during the period of the recall operation state, there is no possibility of accidentally activating the store timing circuit 6 because its operation is disabled by the low level store signal STR, thus preventing data from being destroyed. In FIG. 9A, the hatched area DC indicates the period during which the state of the write enable signal $\overline{WE}$ does not affect the operation. After all pages have been subjected to the recall operation, the chip enable signal $\overline{CE}$ remains HIGH. Under this state, when the output enable signal $\overline{OE}$ goes LOW, the recall/store logic circuit 9 produces the recall latch reset signal $\phi_5$, and outputs it to the recall latch store circuit 10. In response to the recall latch reset signal $\phi_5$, the recall/store latch circuit 10 sets the recall signal REC to LOW to cancel the recall operation mode.

Referring now to FIG. 9B, the store operation is performed in the following manner. First, as shown in FIG. 9B, when the nonvolatile enable signal $\overline{NE}$ in standby state goes LOW and then the write enable signal $\overline{WE}$ and chip enable signal $\overline{CE}$ go LOW, the recall/store logic circuit 9 generates the store operation initiation signal $\phi_4$ (designated SET STORE) and outputs it to the recall/store latch circuit 10. In response to the store operation initiation signal $\phi_4$, the recall/store latch circuit 10 generates the store signal STR (HIGH) and latches it in that state (designated SET STORE). This enables the operation of the store timing circuit 6 while disabling the operation of the other two timing circuits 4 and 5 (store operation mode). Based on the generating timing of the store signal STR, the store timing circuit 6 performs the store operation collectively on the memory cells of the memory array 1. When the store operation is completed (after about 10 msec. as shown in FIG. 9B), the store timing circuit 6 outputs the store operation termination pulse $\phi_2$ to the recall/store latch circuit 10. The signals $\overline{CE}$ and $\overline{OE}$ are set LOW after the store operation mode is set. After the store operation mode is once set, the chip enable signal $\overline{CE}$ and output enable signal $\overline{OE}$ are neglected until the store operation termination pulse $\phi_2$ is set HIGH. The recall/store latch circuit 10 then sets the store signal STR LOW to cancel the store operation mode. At the same time, the recall signal REC is set HIGH to enable the recall operation mode. Thus, the recall operation mode is entered immediately after the termination of the store operation. This prevents the store operation from being performed when the data level in the DRAM unit is deteriorated after termination of the store operation.

When the power is turned on, the supply voltage monitoring circuit 12 (FIG. 1) outputs the power-on detection pulse $\phi_1$ to the recall/store latch circuit 10. In response to the power-on detection pulse $\phi_1$, the recall/store latch circuit 10 sets the recall signal REC to a high level to activate the recall operation mode. As a result, the store operation is disabled immediately after power-on, preventing the data previously stored in the EEPROM unit from being lost. On the other hand, when the power supply voltage drops below a predetermined level (including the power-off operation), the supply voltage monitoring circuit 12 outputs the power-off detection signal $\phi_3$. In response to the power-off detection signal $\phi_3$, the recall/store latch circuit 10 sets the store signal STR to HIGH. This activates the store operation mode so that the data can be retained in the EEPROM unit after the power is turned off.

Figure 2B:
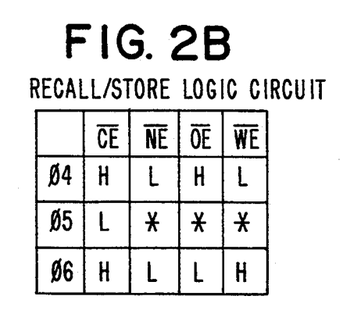
Figure 3B:
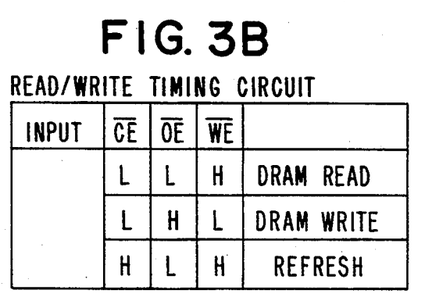
Figure 4B:
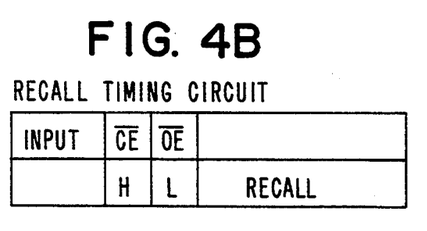

In the embodiment described above, the recall/store logic circuit 9 generates the store operation initiation signal $\phi_4$, recall latch reset signal $\phi_5$ and recall latch set signal $\phi_6$ in accordance with the logic table of FIG. 2A. Alternatively, in another embodiment, these signals $\phi_4$, $\phi_5$ and $\phi_6$ may be generated in accordance with the logic table of FIG. 2B. In FIG. 2B, the mark "*" indicates "don't care" input signals. The read/write timing circuit 4 performs the page-by-page read or write operation or the refresh operation when the chip enable signal $\overline{CE}$, output enable signal $\overline{OE}$ and write enable signal $\overline{WE}$ take the levels as shown in FIG. 3B. The recall timing circuit 5 performs the recall operation when the chip enable signal $\overline{CE}$ and output enable signal $\overline{OE}$ take the levels as shown in FIG. 4B. In this embodiment, the recall and store operations are performed using the timings shown in FIGS. 10A and 10B, respectively. According to this embodiment also, recall of each page can be done, as in the embodiment using the timings shown in FIG. 9A, without inputting the nonvolatile enable signal $\overline{NE}$ for every page during the period of the recall operation mode, thus enabling the external input timing to be simplified. Also, even if noise appears on the write enable signal $\overline{WE}$, nonvolatile enable signal $\overline{NE}$ or output enable signal $\overline{OE}$ or during the period indicated by the hatched area DC in FIG. 10A, there is no possibility of erroneously operating the circuits, thus preventing the data from being destroyed. Furthermore, as in the embodiment using the timings shown in FIG. 9B, the store operation termination pulse $\phi_2$ may be issued to release the store operation state and simultaneously transfer to the recall mode. It is thus possible to prevent the store operation from being continued when the data level in the DRAM unit is deteriorated after termination of the store operation.

Figure 8A:
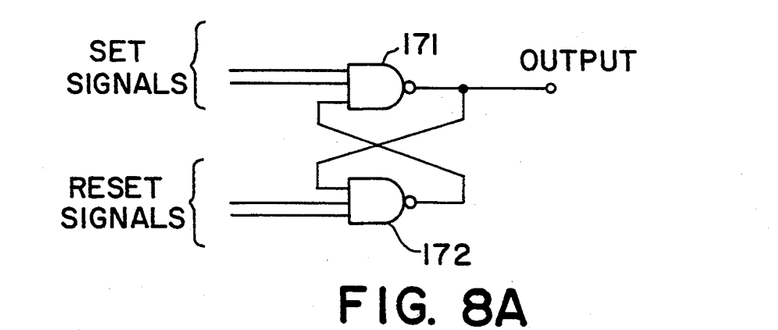
FIGS. 8A and 8B illustrate modifications of the recall/store latch circuit.

The recall/store latch circuit 10 may be constructed in the form of a flip-flop having NAND gates 171 and 172 as shown in FIG. 8A. Alternatively, the recall/store latch circuit 10 may be constructed using NOR circuits 181 and 182 and an inverter 183 as shown in FIG. 8B.

Figure 8B:
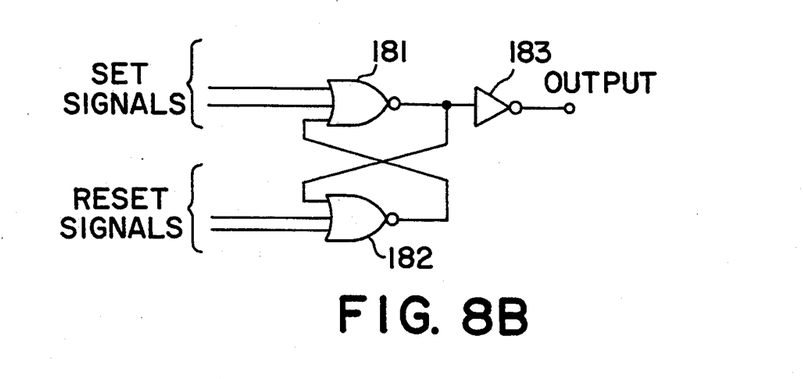

The circuits in FIGS. 8A and 8B are merely latch circuits. The "SET SIGNALS" and "RESET SIGNALS" correspond to the "LATCH SET SIGNALS" and "LATCH RESET SIGNALS" in FIG. 5, respectively. The signal "OUTPUT" represents the output of each of the circuits shown in FIGS. 8A and 8B. It is considered to be within the skills of the artisan to modify the shown circuits to have three SET SIGNAL inputs.

Figure 13:
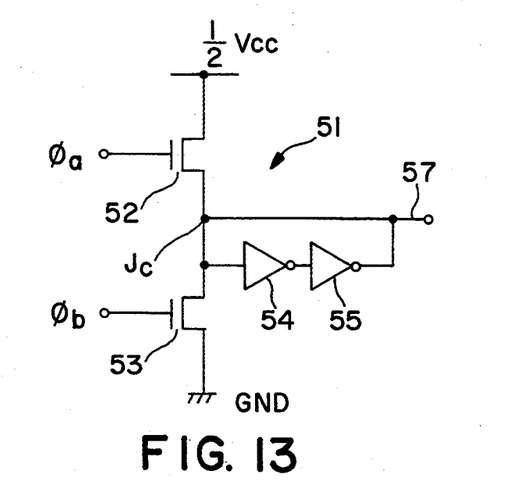
FIG. 13 is a circuit diagram illustrating a precharge circuit used in another semiconductor memory device according to the invention.
Figure 14:
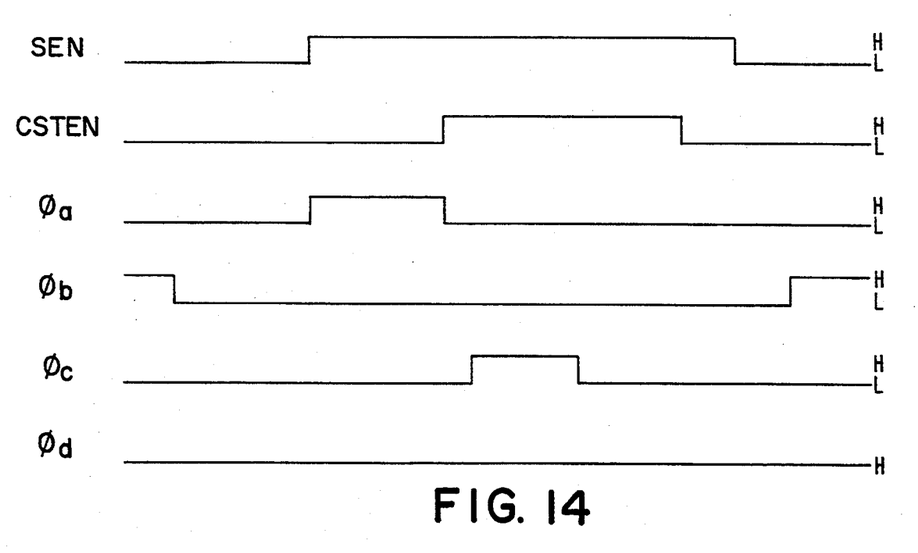
FIG. 14 is a timing chart illustrating the operation of the other semiconductor memory device.

FIG. 13 illustrates a precharge circuit 51 used in another embodiment. FIG. 14 is the timing chart associated with the circuit of FIG. 13. This embodiment is provided with a main amplifying circuit. This main amplifying circuit may be structured in the same manner the main amplifying circuit 200 described above. The precharge circuit 51 comprises two N-transistors 52 and 53, and a series circuit of two inverters 54 and 55. The N-transistor 52 is connected between a power source potential (intermediate potential: $V_{cc}/2$) and a common data line 57. The other N-transistor 53 is connected between the ground GND and a junction point $J_c$ between the common data line 57 and the N-transistors 52. The series circuit of the inverters 54 and 55 is connected as shown in FIG. 13, and functions as a buffer for stabilizing the potential of the common data line 57. A precharge signal $\phi_a$ is coupled to the gate of the N-transistor 52, and another precharge signal $\phi_b$ to the gate of the N-transistor 53.

When the semiconductor memory device having the precharge circuit 51 is in the non-operation mode, the precharge signal $\phi_a$ is LOW, and the precharge signal $\phi_b$ is HIGH, as shown at the left most of FIG. 14. Therefore, the N-transistor 52 is off, and the N-transistor 53 is on, so that the common data line 57 is at the ground level. Since the main amplifier enable signal $\phi_c$ is LOW, the output line 56 of the main amplifying circuit 200 (FIG. 15) is biased to the potential $V_{cc}$ through the P-transistor 65. The P-transistor 64 in the main amplifier 60 is turned on so that the junction points $J_a$ and $J_b$ are biased to the same potential ($V_{cc}$. In the non-operation mode, the write signal $\phi_d$ is maintained HIGH.

Referring to FIGS. 13, 14 and 15 in the read operation mode, the precharge signal $\phi_b$ is set LOW to turn off the N-transistor 53 of the precharge circuit 51, thereby disconnecting the common data line 57 from the ground GND. Then, the precharge signal $\phi_a$ is set HIGH to turn on the N-transistor 52, so that the common data line 57 is biased to the intermediate potential $V_{cc}/2$. At this time, the sense amplifier driving signal SEN is set HIGH, and data of the memory cell appears in the form of a signal on bit lines (not shown). Thereafter, the column select signal CSTEN is set HIGH, so that the bit lines are connected to the data lines D and $\overline{D}$, thereby data of the memory cell to appear on the data lines D and $\overline{D}$. Simultaneously, the precharge signal $\phi_a$ returns from HIGH to LOW to turn off the N-transistor 52, thereby completing the precharge of the common data line 57. The main amplifier enable signal $\phi_c$ is then set HIGH so that the P-transistor 65 is turned off to complete the precharge of the output line 56. At the same time, the P-transistor 64 is turned off, and the N-transistor 63 is turned on. This enables to the combination of the pullup P-transistors 61a and 61b and pulldown N-transistors 62a and 62b to amplify the data signal on the data lines D and $\overline{D}$. The amplified data signal is output through the output line 56.

When the main amplifier enable signal $\phi_c$ is set HIGH, the output of a NAND gate 73 in the connection circuit 70 becomes LOW to turn on the P-transistor 72 and turn off the N-transistor 71. Therefore, the output of the main amplifier 60 on the output line 56 is transferred to the common data line 57 via the transistors 71 and 72. In this way, the data read operation is performed.

According to this embodiment, when a data signal is sent to the common data line 57, the common data line 57 is previously biased to the intermediate potential $V_{cc}/2$. Therefore, a slight potential change in the output of the main amplifier 60 allows the output to exceed the threshold level of the next stage, resulting in that the delay time caused by the common data line can be remarkably shortened as compared with that in a prior art device.

As seen from above, in the memory device according to the invention, the common data line is biased to an intermediate potential by a precharge circuit before a main amplifier begins to amplify a data signal from a memory cell. Consequently, the delay time due to the common data line can be shortened.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A semiconductor memory device comprising:
    an array of memory cells, each of said memory cells comprising volatile memory means and nonvolatile memory means;
    a port for receiving at least a chip enable signal, a nonvolatile enable signal, an output enable signal, and a write enable signal;
    read/write means, operatively coupled to said memory cells and the port, for performing a read operation or a write operation on the volatile memory means;
    recall means, operatively coupled to said memory cells and said port, for performing a recall operation on said memory cells;
    store means, operatively coupled to said memory cells, for performing a store operation on said memory cells;
    operation control means, operatively coupled to said port, said read/write means, said recall means and said store means, for generating first and second signals to said read/write, recall and store means on the basis of said chip enable signal, nonvolatile enable signal, output enable signal and write enable signal, said first signal, supplied to said recall means directly and supplied to said read/write means through inverting means for inverting the logic level of a signal, and being indicative of the disabling of said read/write means and said store means, the second signal, supplied to the store means directly and supplied to said read/write means through the inverting means, and being indicative of the disabling of said read/write means and said recall means;
    said operation control means comprising logic means for judging a possibility that data stored in said volatile memory means is different from data stored in said nonvolatile memory means as a function of at least one of said chip enable signal, said non-volatile enable signal, said output enable signal and said write enable signal, and
    wherein said operation control means supplies said second signal to said store means to initiate said store operation only after said logic means judges said possibility to exist.

2. A semiconductor memory device according to claim 1, wherein said read/write means performs a refresh operation on said volatile memory means.

3. A semiconductor memory device according to claim 1, wherein said store means is enabled when said second signal is generated.

4. A semiconductor memory device according to claim 1, wherein said operation control means comprises latch means for latching only one of said first and second signals.

5. A semiconductor memory device according to claim 1, wherein said operation control means comprises reset means for resetting one of said first and second signals when the other of said first and second signals is to be generated.

6. A semiconductor memory device according to claim 1, said memory device further including:
    an I/O port;
    a main amplifying circuit for amplifying a data signal which is read from one of said memory cells, said main amplifying circuit being connected to a power source potential;
    a common data line, connected to said main amplifying circuit and said I/O port of said memory device, for transferring the amplified data signal to said I/O port of said memory device; and
    a precharge circuit connected to said common data line and a predetermined potential other than said power source potential, for biasing said common data line to a level of said predetermined potential before said main amplifying circuit begins to amplify the data signal.

7. A semiconductor memory device according to claim 6, wherein the predetermined potential level is between said power source potential and a ground level.

8. A semiconductor memory device according to claim 6, wherein said predetermined potential level is half of the power source potential.

9. A semiconductor memory device according to claim 6, wherein said precharge circuit comprises a series circuit of two transistors, one of said transistors being connected to said predetermined potential, the other of said transistors being connected to a ground.

10. A semiconductor memory device according to claim 1, wherein said memory device further comprises monitor means, operatively coupled to said operation control means, for monitoring a power supply voltage, and for generating a power-on signal indicative that said memory device is powered on, and said operation control means comprises latch means for latching only one of said first and second signals, said latch means being set to latch said first signal, when said power-on signal is generated.

11. A semiconductor memory device according to claim 1, wherein said memory device further comprises monitor means, operatively coupled to said operation control means, for monitoring a power supply voltage, and for generating a power-off signal indicative that said memory device is powered off, and said operation control means comprises latch means for latching only one of said first and second signals, the latch means being set to latch said second signal, when the power-off signal is generated.

12. A semiconductor memory device according to claim 1, wherein said operation control means generates said first signal when the store operation is completed.

* * * * *

UNITED STATES PATENT AND TRADEMARK OFFICE
CERTIFICATE OF CORRECTION

PATENT NO. : 5,414,671
DATED : May 9, 1995
INVENTOR(S) : Katsumi Fukumoto

It is certified that error appears in the above-indentified patent and that said Letters Patent is hereby corrected as shown below:

column 7, line 60:
    READS: "Referring again to FIG. 5, the",
    SHOULD READ: --The--;

column 8, line 7:
    READS: "The inverters",
    SHOULD READ: --Referring again to Figure 5, the inverters--;

column 8, line 53:
    READS: "$\phi_2$ the power-on detection pulse $\phi_{14}$or the recall",
    SHOULD READ: --$\phi_2$, the power-on detection pulse $\phi_1$ or the recall--;

column 9, line 18:
    READS: "HIGH to LOW to HIGH",
    SHOULD READ: --HIGH to LOW to the transition of timing signal $\phi_2$ from LOW to HIGH--;

UNITED STATES PATENT AND TRADEMARK OFFICE
CERTIFICATE OF CORRECTION

PATENT NO. : 5,414,671
DATED : May 9, 1995
INVENTOR(S) : Katsumi Fukumoto

It is certified that error appears in the above-indentified patent and that said Letters Patent is hereby corrected as shown below:

column 10, line 26:
        READS:    "SET STORE:,
        SHOULD READ:   --STORE ENABLE--:

column 12, line 10:
        READS:    "($V_{cc}$.",
        SHOULD READ:   --($V_{cc}$).--;

column 12, line 12:
        READS:    "and 15 in",
        SHOULD READ:   --and 15, in--.

Signed and Sealed this

Tenth Day of October, 1995

Attest:

BRUCE LEHMAN

Attesting Officer         *Commissioner of Patents and Trademarks*